United States Patent
Lauermann et al.

(10) Patent No.: US 10,128,413 B2
(45) Date of Patent: Nov. 13, 2018

(54) LIGHT EMITTING DIODE

(71) Applicant: AZUR SPACE Solar Power GmbH, Heilbronn (DE)

(72) Inventors: Thomas Lauermann, Heilbronn (DE); Daniel Fuhrmann, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 15/919,731

(22) Filed: Mar. 13, 2018

(65) Prior Publication Data
US 2018/0261728 A1  Sep. 13, 2018

(30) Foreign Application Priority Data

Mar. 13, 2017  (DE) .................. 10 2017 002 332

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |
| *H01L 33/38* | (2010.01) |
| *H01L 33/40* | (2010.01) |
| *H01L 33/30* | (2010.01) |
| *H01L 33/06* | (2010.01) |

(52) U.S. Cl.
CPC ............ *H01L 33/382* (2013.01); *H01L 33/06* (2013.01); *H01L 33/30* (2013.01); *H01L 33/40* (2013.01)

(58) Field of Classification Search
CPC ....... H01L 33/382; H01L 33/06; H01L 33/30; H01L 33/40
USPC .......................................................... 257/13
See application file for complete search history.

(56) References Cited

U.S. PATENT DOCUMENTS

| | | | |
|---|---|---|---|
| 7,994,519 B2 | 8/2011 | Fehrer et al. | |
| 2010/0155759 A1* | 6/2010 | Nagawa | H01L 33/0045 257/98 |

FOREIGN PATENT DOCUMENTS

DE  10 2007 032 555 A1  1/2009

* cited by examiner

*Primary Examiner* — David S Blum
(74) *Attorney, Agent, or Firm* — Muncy, Geissler, Olds & Lowe, P.C.

(57) ABSTRACT

A light emitting diode with a stacked structure, having a first region and a second region, wherein both regions comprise the following layers in the stated order, a carrier layer and an n-doped lower cladding layer and an electromagnetic radiation-generating active layer. The active layer comprises a quantum well structure and a p-doped upper cladding layer, and the first region additionally comprises a tunnel diode formed on the upper cladding layer from a $p^+$-layer and an $n^+$-layer, and an n-doped current distribution layer, wherein the current distribution layer and the n-doped contact layer are covered with a conductor track layer structure. At least the lower cladding layer, the active layer, the upper cladding layer, the tunnel diode and the current distribution layer are monolithic. The second region has a contact hole with a bottom region, an injection barrier being formed in the bottom region of the contact hole.

15 Claims, 2 Drawing Sheets

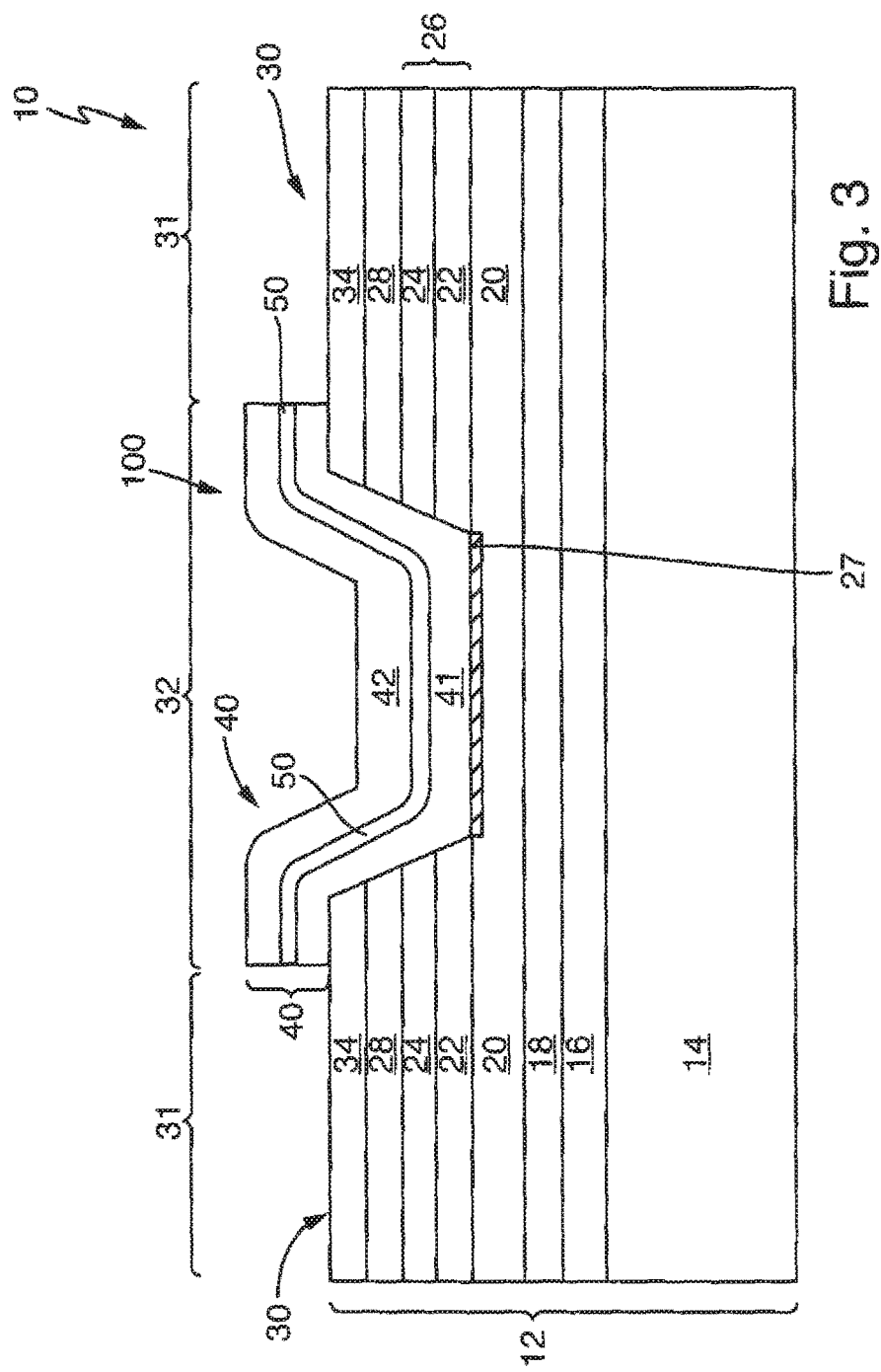

LIGHT EMITTING DIODE

This nonprovisional application claims priority under 35 U.S.C. § 119(a) to German Patent Application No. 10 2017 002 332.8, which was filed in Germany on Mar. 13, 2017, and which is herein incorporated by reference.

BACKGROUND OF THE INVENTION

Field of the Invention

The present invention relates to a light emitting diode.

Description of the Background Art

From DE 10 2007 032 555 A1, which corresponds to U.S. Pat. No. 7,994,519, a light emitting diode is known which has an injection barrier to improve decoupling efficiency between a contact layer and an active region, wherein the injection barrier suppresses a vertical current flow from the contact in the direction of the active region.

SUMMARY OF THE INVENTION

It is therefore an object of the present invention to provide a device which further develops the prior art.

According to an exemplary embodiment of the invention, a light emitting diode with a stacked structure having a top and a bottom is provided.

The stacked structure is formed mainly of III-V semiconductor layers and has a first region and a second region on the top, wherein both regions can have the following semiconductor layers in the order stated: a carrier layer and an n-doped lower cladding layer and an electromagnetic radiation-generating active layer, wherein the active layer comprises a quantum well structure and a p-doped upper cladding layer.

The first region additionally has a tunnel diode arranged on the upper cladding layer (20), which is formed of a $p^+$-layer and an $n^+$-layer, wherein the $p^+$-layer of the tunnel diode consists of a III-arsenide or comprises a III-arsenide, and the $n^+$-layer of the tunnel diode consists of a III-phosphide or comprises a III-phosphide.

Also, the first region has an n-doped current distribution layer, wherein the current distribution layer consists of a III-arsenide or comprises a III-arsenide.

The first region has an n-doped contact layer, wherein the n-doped contact layer consists of a III-arsenide or comprises a III-arsenide.

The n-doped contact layer is covered with a conductor track layer structure.

The layers additionally mentioned for the first region are arranged in the stated order.

At least the lower cladding layer, the active layer, the upper cladding layer, the tunnel diode and the current distribution layer are monolithic.

The second region does not comprise, or at least partially comprises, the additional layers of the first region.

The second region has a contact hole with an upper edge surface, and a side surface and a bottom surface, wherein the following layers are additionally formed in the bottom region of the contact hole. An injection barrier formed flat in the upper cladding layer or on the surface of the upper cladding layer or above the upper cladding layer, in order to suppress a current flow counter to the stacking direction, wherein the injection barrier comprises a p/n-junction and/or an insulating layer or consists of a p/n-junction or an insulating layer, and a conductor track layer structure is covered by the injection barrier, wherein the conductor track layer structure comprises a first metallic layer and a second metallic layer formed above the first layer.

The contact hole can have a planar bottom region. The bottom region is formed in one embodiment from the upper cladding layer.

In an embodiment, at least the current distribution layer and the $n^+$-phosphide layer of the tunnel diode are completely removed from the bottom region.

In an embodiment, the $p^+$-arsenide layer of the tunnel diode can also be missing from the bottom region, i.e., the tunnel diode can be completely removed from the bottom region.

The area of the contact hole can be flat on the upper side and serves as a pad area for electrical contacting of the LED. In other words, the pad area is connected by means of a bonding wire with one of the LED terminals.

Due to the almost closed metallization layer and the injection barrier, no light decoupling takes place across the second region.

Furthermore, the regions can adjoin at the top.

The first region can be partially covered with metallic contact layers.

A division of the surface of the stack into the two regions is performed by means of a mask process.

The term "III-arsenide" can be understood to mean semiconductor materials such as, for example, InGaAs or GaAs or AlGaAs.

Accordingly, the term "III-phosphide" can be understood to mean semiconductor materials, for example InGaP or InAlP or InP.

A concept of the stacked structure can involve semiconductor layers arranged one on the other, or that the stack if formed of the semiconductor layers arranged on one another.

The layers can be produced by means of metalorganic vapor phase epitaxy (MOVPE), starting from the lower cladding layer up to and including the n-doped contact layer. Depending on the type of production, the monolithically formed layers can also be bonded to a carrier layer.

The additional layers resting on the active layer, including the layers of the tunnel diode, can be formed as transparent as possible for the emission wavelength of the active layer.

An advantage of the present structure is that the light efficiency can be increased in a simple and cost-effective manner. The injection barrier in the contact hole contributes, among other things, to an increase in the light efficiency.

As a result, the current injection is minimized in the area below the bonding pad in a simple manner, so that an increased efficiency of the component is achieved. It should be noted that the term light efficiency can be understood to mean the luminous flux measured in MW in relation to the power consumption of the LED component.

Surprisingly, it was found that the uppermost, heavily doped $n^+$-tunnel diode phosphide layer acts in a highly selective manner to wet etching. In other words, the phosphide layer provides an etch stop layer for the wet etch. Even with a longer wet etch time, the phosphide layer is not etched away.

The wet etching can be carried out by means of a wet etch solution with a strong anisotropic effect, for example with a peroxide-phosphoric acid. Here, the first regions are protected against the attack of the wet etch solution by means of a resist mask. It is understood that instead of wet etching, a dry etching process can also be used.

In a subsequent process step, for example, wet etching step, the $n^+$-type phosphide tunnel diode layer can be removed. Hydrochloric acid can be used for this purpose. Studies have shown that with hydrochloric acid, the $n^+$-phosphide tunnel diode layer can be removed very selectively up to the immediately underlying $p^+$-arsenide tunnel diode layer. In a further wet etching step, the previously exposed $p^+$-arsenide tunnel diode layer can subsequently also be removed.

In an embodiment, a metal layer containing n-dopants is applied to the bottom region of the contact hole. By the bottom region being formed by the $p^+$-tunnel diode layer or, in a further development, by the upper cladding layer, an injection barrier in the form of a blocking p/n junction can be easily and inexpensively formed.

In an embodiment, an AlGaAs layer is formed in the bottom region of the contact hole.

In an embodiment, a semiconductor material different from the semiconductor material that forms the side surfaces and the bottom surface is disposed on the bottom surface of the contact hole, wherein the bottom surface is n-doped by means of the different semiconductor material, and a heterojunction forms in the region of the bottom surface.

In an embodiment, the contact hole can be filled with a layer sequence of semiconductor materials and metals, wherein the first metallic layer is a first metal that is materially connected to the different semiconductor material.

In an embodiment, a second metal is disposed above the first metal as the second metallic layer, wherein the second metal is different from the first metal.

In an embodiment, an electrically conductive layer of a refractory metal or a diffusion barrier is disposed between the first metal and the second metal to suppress the diffusion of portions of the second metal into the first metal.

In an embodiment, the refractory metal can contain or consists of Ti or Cr or Ni or Mo or W or of a compound of the metals.

In an embodiment, an n-doped contact layer can be arranged on the current distribution layer, wherein the n-doped contact layer consists of a III-arsenide or comprises a III-arsenide, and the recess penetrates the contact layer.

In an embodiment, the upper edge surface and/or the side surfaces of the recess can be at least partially or completely filled.

In an embodiment, the first metal is formed of the group of the metals Au, Ni, Pd, Pt or of an alloy of the metals Au, Ni, Pd, Pt.

In an embodiment, the different semiconductor material comprises one or more of the elements Si, Ge, Te, Mg, C and Zn.

In an embodiment, the second metal is formed predominantly of Ag or Au or Cu or Al or of an alloy of the metals.

The current distribution layer can have a sheet resistance $R < 70$ $\Omega/_\blacksquare$, and the cladding layer has a sheet resistance $R > 400$ $\Omega/_\blacksquare$.

In an embodiment, the current distribution layer can comprise an n-doped $Al_xGa_{1-x}As$ layer with an Al content x between 0% and 20%.

In an embodiment, the stacked structure can have an emission wavelength greater than 600 nm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 is a sectional view along the line A-A taken from FIG. 1.

DETAILED DESCRIPTION

Figure 1:
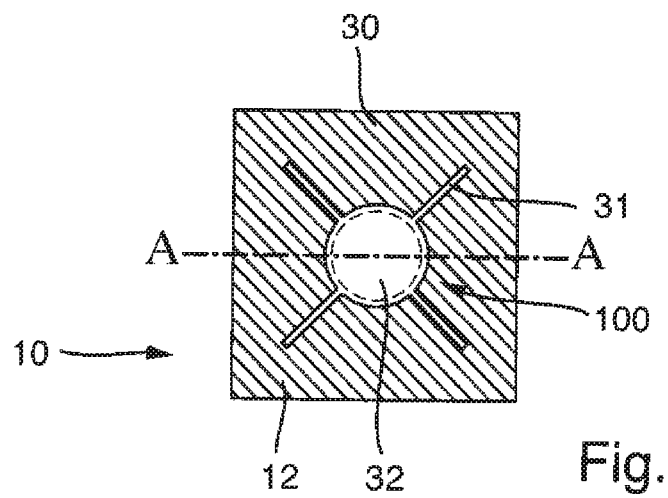
FIG. 1 is a plan view of an embodiment according to the invention of a light emitting diode.

The illustration of FIG. 1 shows a plan view of a first embodiment of a light emitting diode 10 according to the invention, comprising a stacked structure 12 formed essentially of III-V semiconductor materials, wherein a top 30 has a first region 31 and a second region 32.

The first region 31 includes the four fingers extending away from the ring and the intervening regions. The second region 32 extends across the circular area enclosed by the ring. The circular area indicates a contact hole 100 filled with a metallic layer sequence.

Figure 2:
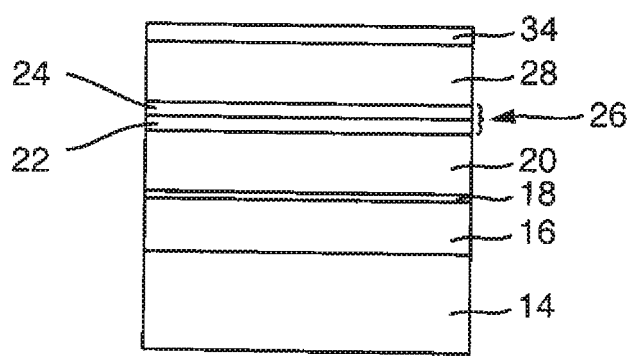
FIG. 2 is a side view of the embodiment according to the invention of a stacked structure of a light emitting diode.

A structure of the stacked structure 12 is shown in the illustration of FIG. 2 in a side view.

The structure 12 has a carrier layer 14, an n-doped lower cladding layer 16, an electromagnetic radiation-generating active layer 18. Furthermore, the structure 12 has a p-doped upper cladding layer 20, a tunnel diode 26 that is formed from a $p^+$-layer 22 and an $n^+$-layer 24, and an n-doped current distribution layer 28. On the current distribution layer 28, an n-contact layer 34 is arranged.

The layers can be arranged in the stated order. The active layer 18 comprises a quantum well structure. The layers are monolithic, i.e., the layers are grown directly on the carrier layer.

The first region 31 is formed from the n-doped contact layer 34 and serves for current coupling.

The second region 32 is formed from the upper cladding layer 20 and the $p^+$-arsenide layer 22 of the tunnel diode 26, wherein both the current distribution layer 28 and the $n^+$-phosphide layer 24 of the tunnel diode 26 are completely absent. In a further development, the second region 32 is formed from the upper cladding layer 20, wherein both the current distribution layer 28 and the $n^+$-phosphide layer 24 and the $p^+$-arsenide layer of the tunnel diode 26 are missing.

In the illustration of FIG. 3, a section along the lines A-A from FIG. 1 is shown. In the following, only the differences from the representation in FIG. 1 are explained. To simplify the illustration, all layers arranged underneath the upper cladding layer 20 are not shown.

A cross section of the annular structure of the first region 31 and the second region 32 can be seen, wherein the first region 31 is formed by the n-doped contact layer 34 which is disposed on the current distribution layer 28.

The first region 31 is followed by the second region 32 formed by the upper cladding layer 20, whereby the upper side 30 of the stacked structure has a step in the area of the transition. The step with an upper edge region and circumferential side surfaces forms part of a contact hole 100 with a planar bottom region.

An injection barrier 27 is formed on or in the bottom region of the contact hole 100 in order to suppress current input counter to the stacking direction. Preferably, the injection barrier comprises a p/n junction. The side walls and the upper edge region of the contact hole 100 are filled with a conductor track layer structure 40. Preferably, the conductor track layer structure 40 is conformally deposited.

The conductor track layer structure 40 comprises a first metallic layer 41 and an electrically conductive layer 50 with a refractory metal that is formed cohesively on the first metallic layer 41. On the electrically conductive layer 50, a second metallic layer 42 is cohesively formed.

The first metallic layer 41 comprises palladium and germanium. The second metallic layer 42 comprises silver with proportions of gold and palladium. The refractory metal comprises or consists of titanium.

The conductor track layer structure 40 serves to receive a bonding pad.

The contact resistance between the side wall surfaces and the upper surface 30 and the conductor track layer structure 40 is at least 10 times smaller than the contact resistance between the conductor track layer structure 40 and the bottom region of the contact hole 100 in order to thereby suppress a current flow directed toward the active layer 18.

In an embodiment, instead of a p/n junction, an insulating layer is formed in the bottom region of the contact hole 100, in order to form an injection barrier. On the insulating layer, which is preferably thinner than 150 nm, the layers of the conductor track layer structure 40 are formed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A light emitting diode with a stacked structure formed primarily of III-V semiconductor layers, the light emitting diode comprising:
    a first region and a second region, wherein the first region and the second region comprise the following semiconductor layers: a carrier layer; an n-doped lower cladding layer; an electromagnetic radiation-generating active layer comprising a quantum well structure; a p-doped upper cladding layer, wherein the first region additionally comprises a tunnel diode that is formed on the upper cladding layer from a $p^+$-layer and an $n^+$-layer, and wherein the $p^+$-layer of the tunnel diode comprises a III-arsenide, and the $n^+$-layer of the tunnel diode comprises a III-phosphide;
    an n-doped current distribution layer, wherein the current distribution layer comprises a III-arsenide; and
    an n-doped contact layer, wherein the n-doped contact layer comprises a III-arsenide, the n-doped contact layer being covered with a conductor track layer structure,
    wherein at least the lower cladding layer, the active layer, the upper cladding layer, the tunnel diode and the current distribution layer are monolithic,
    wherein the second region does not or partially comprises the additional layers of the first region,
    wherein the second region has a contact hole with an upper edge surface and a side surface and a bottom surface, and
    wherein, in a bottom region of the contact hole an injection barrier is formed flat in the upper cladding layer or on the surface of the upper cladding layer or above the upper cladding layer to suppress a current flow counter to the stacking direction,
    wherein the injection barrier comprises a p/n transition and/or an insulation layer,
    wherein a conductor track layer structure is provided with which the injection barrier is covered, and
    wherein the conductor track layer structure comprises a first metallic layer and a second metal layer formed above the first layer.

2. The light emitting diode according to claim 1, wherein, in a region of the bottom of the contact hole, an AlGaAs layer is formed.

3. The light emitting diode according to claim 1, wherein, on the bottom surface, a semiconductor material different from the semiconductor material that is formed opposite the side surfaces and the bottom surface is arranged, wherein the bottom surface is n-doped by means of a different semiconductor material, and wherein a heterojunction is formed in the region of the bottom surface.

4. The light emitting diode according to claim 1, wherein the contact hole is filled with a layer sequence of semiconductor materials and metals, and wherein the first metallic layer is a first metal that is cohesively connected with the different semiconductor material.

5. The light emitting diode according to claim 4, wherein above the first metal, a second metal is arranged as the second metallic layer, and wherein the second metal is different from the first metal.

6. The light emitting diode according to claim 5, wherein, between the first metal and the second metal, an electrically conductive layer made from a refractory metal, or a diffusion barrier, is arranged in order to suppress the diffusion of portions of the second metal into the first metal.

7. The light emitting diode according to claim 6, wherein the refractory metal contains Ti or Cr or Ni or Mo or W or is formed of a compound of the metals.

8. The light emitting diode according to claim 1, wherein an n-doped contact layer is arranged on the current distribution layer, and wherein the n-doped contact layer comprises a III-arsenide and the recess penetrates the contact layer.

9. The light emitting diode according to claim 1, wherein the upper edge surface and/or the side surfaces of the recess are at least partially or completely filled.

10. The light emitting diode according to claim 1, wherein the first metal is from the group of metals Au, Ni, Pd, Pt or is an alloy of the metals Au, Ni, Pd, Pt.

11. The light emitting diode according to claim 1, wherein the different semiconductor material comprises one or more of the elements Si, Ge, Te, Mg, C and Zn.

12. The light emitting diode according to claim 1, wherein the second metal is formed of Ag or Au or Cu or Al or of an alloy of the metals.

13. The light emitting diode according to claim 1, wherein the current distribution layer has a sheet resistance $R<70$ $\Omega/\blacksquare$, and the cladding layer has a sheet resistance $R>400$ $\Omega/\blacksquare$.

14. The light emitting diode according to claim 1, wherein the current distribution layer has an n-doped $Al_xGa_{1-x}As$ layer with an Al content x between 0% and 20%.

15. The light emitting diode according to claim 1, wherein the stacked structure has an emission wavelength of greater than 600 nm.

* * * * *